(12) United States Patent
Cress et al.

(10) Patent No.: US 6,191,636 B1
(45) Date of Patent: Feb. 20, 2001

(54) INPUT BUFFER/LEVEL SHIFTER

(75) Inventors: Daniel Eric Cress, Starkville; Jeffery Scott Hunt, Ackerman; Muthu Nagarajan, Starkville, all of MS (US)

(73) Assignee: Cypress Semiconductor Corp., San Jose, CA (US)

( * ) Notice: Under 35 U.S.C. 154(b), the term of this patent shall be extended for 0 days.

(21) Appl. No.: 09/400,685

(22) Filed: Sep. 22, 1999

(51) Int. Cl.[7] .................................................. H03L 5/00
(52) U.S. Cl. .................................. 327/333; 327/112
(58) Field of Search ................................... 327/112, 333, 327/427, 434, 437; 326/80–83, 62, 63, 68

(56) References Cited

U.S. PATENT DOCUMENTS

| | | | |
|---|---|---|---|
| 4,121,203 | * 10/1978 | Edwards et al. | 340/336 |
| 4,713,600 | * 12/1987 | Tsugaru et al. | 323/351 |
| 5,903,142 | 5/1999 | Mann | 323/313 |
| 6,069,515 | * 5/2000 | Singh | 327/309 |
| 6,094,083 | * 7/2000 | Noda | 327/333 |
| 6,107,857 | * 8/2000 | Orisaka et al. | 327/333 |

* cited by examiner

Primary Examiner—My-Trang Nu Ton
(74) Attorney, Agent, or Firm—Christopher P. Maiorana, P.C.; Robert M. Miller

(57) ABSTRACT

A circuit is presented comprising a first device and a second device. The first device may be configured to operate at a first supply voltage and may be configured to generate a pull-up signal in response to an input signal. The second device may be configured to operate at a second supply voltage. The second supply voltage may be lower than the first supply voltage. The second device may be configured to generate an output in response to (i) the input signal and (ii) the pull-up signal.

18 Claims, 3 Drawing Sheets

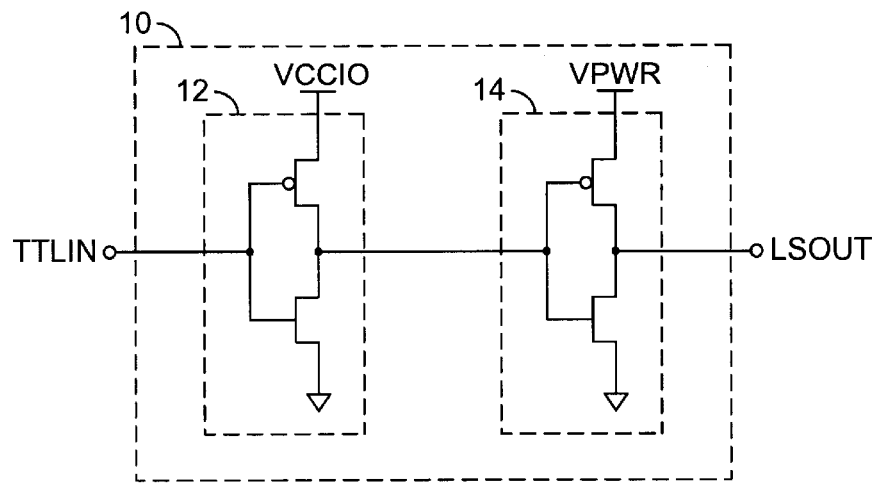
FIG. 1
(CONVENTIONAL)
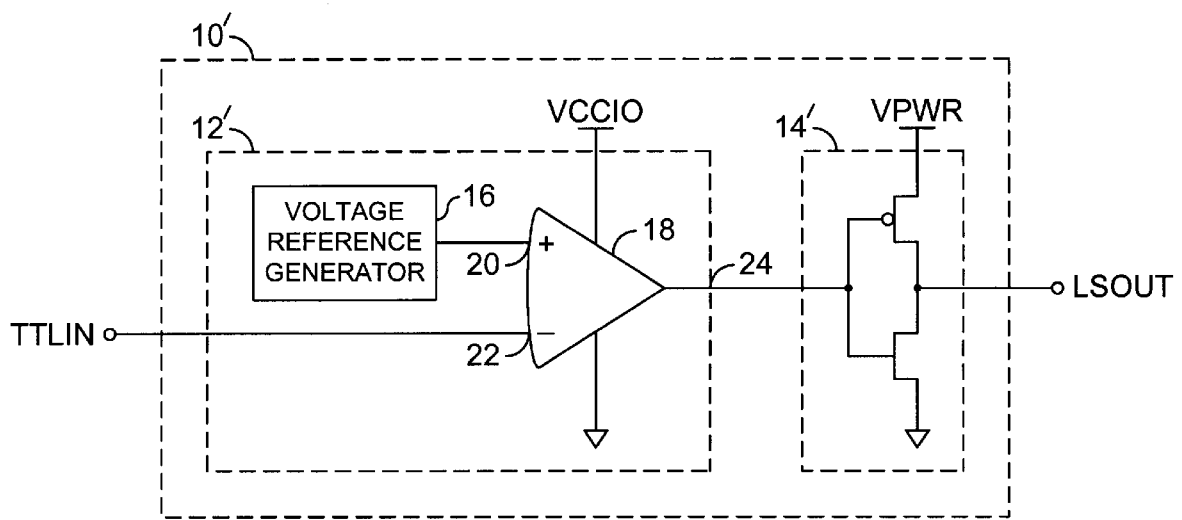
FIG. 2
(CONVENTIONAL)

INPUT BUFFER/LEVEL SHIFTER

FIELD OF THE INVENTION

The present invention relates to a level shifter generally and, more particularly, to an input buffer/level shifter.

BACKGROUND OF THE INVENTION

The trend in modern central processing units (CPUs) and microprocessors is to reduce the power supply operating voltage in order to reduce power consumption and increase the chip density. The power supply reduction may impact other performance considerations as well. Due to the design considerations, memory devices, such as dynamic random access memories (DRAMs), may operate at a different supply voltage than the CPU. Some devices also may be required to use more than one power supply voltage so they can signal a CPU related device at one voltage and other devices at another voltage. The signals are generally generated by one circuit and are received by another circuit.

One such configuration occurs with modern microprocessors that operate with a nominal power supply voltages of about 2.5V, 1.8V, or lower, while other circuits in the computer operate with a power supply voltage of about 3.3V. To facilitate communication between devices operating at different voltages, an input buffer/level shifter circuit is used.

Referring to FIG. 1, a circuit diagram illustrates a conventional level shifter 10. The level shifter 10 generates an output signal LSOUT in response to an input signal TTLIN. The level shifter 10 has a stage 12 and a stage 14. The stage 12 is a CMOS inverter powered by the I/O power supply VCCIO. The stage 14 is a CMOS inverter powered by the core supply VPWR. The signal TTLIN swings between ground and VCCIO. The stage 12 inverts the signal TTLIN and presents the inverted signal to the stage 14. The swing of the output of 12 is between ground and VCCIO. The stage 14 inverts the signal received from the stage 12 and presents the signal LSOUT at an output. The signal LSOUT swings between ground and VPWR.

Referring to FIG. 2, a circuit diagram illustrates another conventional level shifter 10'. The circuit 10' has two stages 12' and 14'. The stage 12' consists of a differential amplifier 18 and a voltage reference generator (VRG) 16. The VRG 16 is connected to the positive input 20 of the differential amplifier 18. The VRG sets the trip point for the stage 12'. The input signal TTLIN is presented at the negative input 22. The differential amplifier 18 presents a signal indicative of the input level with respect to the VRG level. The stage 14' is a CMOS inverter powered by the core supply VPWR. The stage 14' inverts the signal received from the differential amplifier 18 and generates the signal LSOUT that swings between ground and VPWR.

With the increasing speeds and ever shrinking area that modern chips must work with, an input buffer/level shifter that operates faster, requires less space than the conventional designs, and uses no standby current for low power is desirable. The VRG 16 uses a current source, and requires standby current.

SUMMARY OF THE INVENTION

The present invention concerns a circuit comprising a first device and a second device. The first device may be configured to operate at a first supply voltage and may be configured to generate a pull-up signal in response to an input signal. The second device may be configured to operate at a second supply voltage that is lower than the first supply voltage. The second device may be configured to generate an output signal in response to (i) the input signal and (ii) the pull-up signal.

The objects, features and advantages of the present invention include providing a circuit that may (i) operate nearly twice as fast as a two stage CMOS inverter design, (ii) require no reference voltages, (iii) requires zero (or negligible) stand-by current (neglecting sub-threshold leakage), (iv) have a relatively small layout footprint, (v) provide a tighter Vih/Vil window across process and temperature corners, and/or (vi) provide an improved speed/ power product.

BRIEF DESCRIPTION OF THE DRAWINGS

These and other objects, features and advantages of the present invention will be apparent from the following detailed description and the appended claims and drawings in which:

FIG. 1 is a circuit diagram illustrating the components of a conventional two-stage CMOS inverter level shifter;

FIG. 2 is a diagram illustrating the components of a conventional level shifter using a differential amplifier;

and

Figure 5:
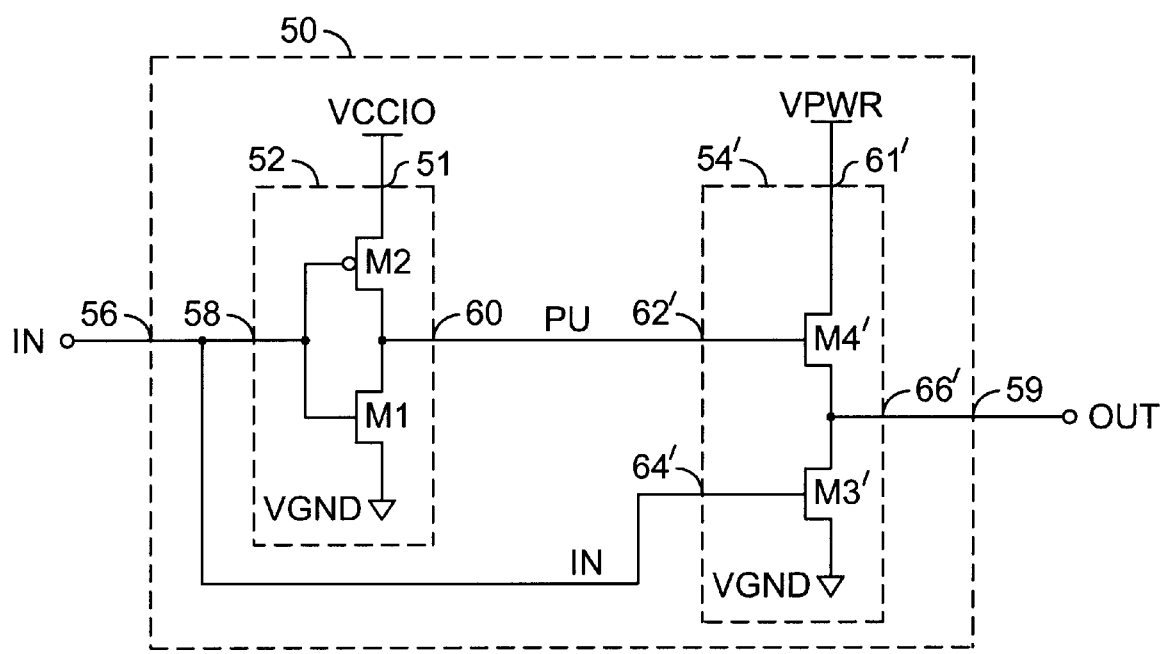

FIG. 5 is a circuit diagram illustrating an alternative implementation of a preferred embodiment of the present invention.

DETAILED DESCRIPTION OF THE PREFERRED EMBODIMENTS

Figure 3:
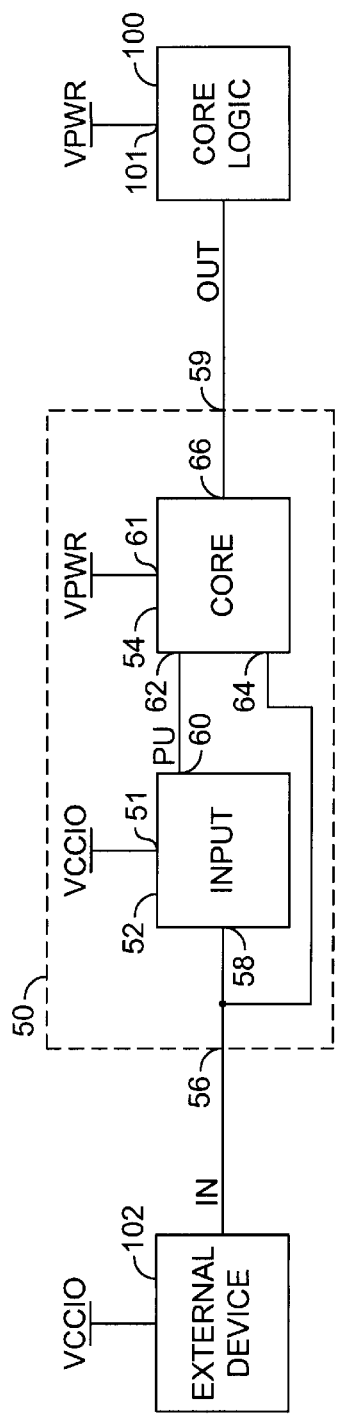
FIG. 3 is a block diagram illustrating a preferred embodiment of the present invention.

Referring to FIG. 3, a block diagram of a circuit 50 is shown in accordance with a preferred embodiment of the present invention. The circuit 50 may be implemented as (i) an input buffer and/or (ii) a level shifter. The circuit 50 is shown implemented, in one example, with a core logic circuit 100 and a circuit 102. The circuit 102 may be an external device operating at a higher voltage than the core logic circuit 100.

The circuit 50 may have an input 56 and an output 59. The circuit 50 may be configured to receive an input signal (e.g., IN) at the input 56 from the circuit 102. The signal IN will generally swing between a ground potential (e.g., VGND) and a first supply voltage (e.g., VCCIO). In one example, the supply voltage VCCIO may vary between 0.1V and 5.0V, more preferably between 0.5V and 4.5V, most preferably between 2.2V and 3.7V. However, other voltages may be implemented accordingly to meet the design criteria of a particular implementation. The circuit 50 may be configured to generate an output signal (e.g., OUT) at the output 59. The signal OUT will generally swing between the ground voltage VGND and a second supply voltage (e.g., VPWR). In one example, the second supply voltage VPWR may vary between 0.1V and 2.0V, more preferably between 0.5V and 2.0V, most preferably between 1.6V and 2.0V. However, other voltages may be implemented accordingly to meet the design criteria of a particular implementation. For example, the highest value of the second supply voltage VPWR should generally be less than the lowest value of the first supply voltage VCCIO by a value equal to the threshold voltage of a NMOS transistor minus the threshold voltage of an PMOS transistor. The supply voltage VCCIO may be an input supply voltage. The supply voltage VPWR may be a core supply voltage. The output 59 may be connected to the core logic circuit 100. The core logic circuit 100 may have an input 101 that may receive the second supply voltage VPWR. The external circuit 102 may operate at the supply voltage VCCIO.

The circuit 50 generally comprises a circuit 52 and a circuit 54. The circuit 52 may be implemented, in one example, as an input circuit. The circuit 54 may be implemented, in one example, as a core circuit. The circuit 52 generally comprises an input 51, an input 58, and an output 60. The input 51 may be connected to the supply voltage VCCIO. The input 58 may be configured to receive the signal IN. A pull-up signal (e.g., PU) may be generated at the output 60 in response to the signal IN and the supply voltage VCCIO.

The circuit 54 generally comprises an input 61, an input 62, an input 64, and an output 66. The input 61 may be connected to the supply voltage VPWR. The input 62 may receive the signal PU. The input 64 may receive the signal IN. The circuit 54 may be configured to generate the signal OUT at the output 66 in response to (i) the signal IN, (ii) the signal PU, and (iii) the supply voltage VPWR. The output 66 may be connected to the output 59.

Figure 4:
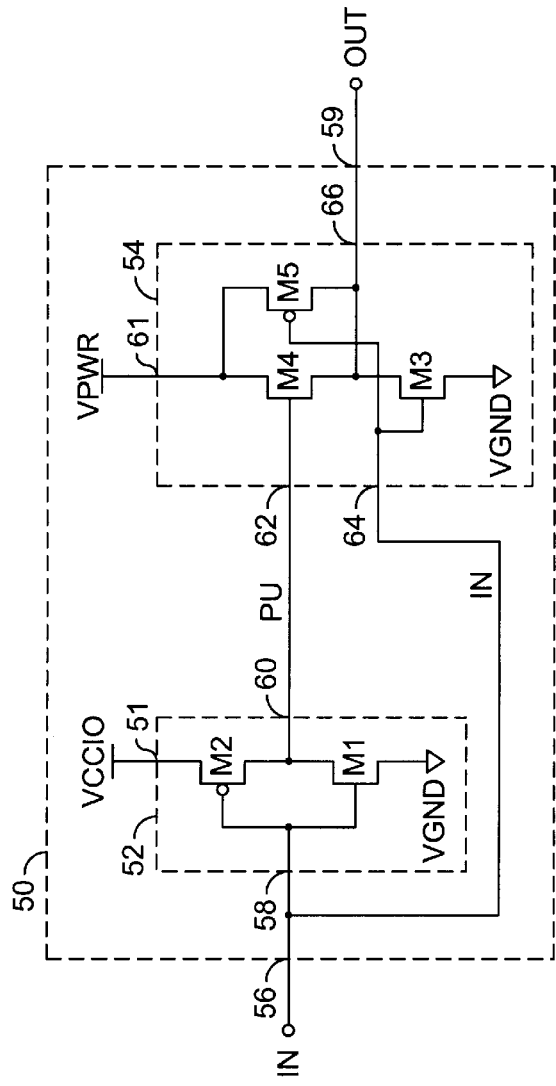
FIG. 4 is a detailed circuit diagram illustrating an implementation of a preferred embodiment of the present invention.

Referring to FIG. 4, a detailed circuit diagram illustrating the components in one implementation of a preferred embodiment of the present invention is shown. The circuit 52 generally comprises a transistor M1 and a transistor M2. In one example, the transistor M1 may be an NMOS transistor and the transistor M2 may be a PMOS transistor. The transistors M1 and M2 may be implemented as one or more MOSFET transistors. However, other types of transistors may be implemented accordingly to meet the design criteria of a particular implementation. The transistors M1 and M2 may be configured as a CMOS inverter. The gates of the transistors M1 and M2 may be connected to the input 58. The source of the transistor M1 may be connected to the ground voltage VGND. The source of the transistor M2 may be connected to the supply voltage VCCIO. The drains of the transistors M1 and M2 may be connected to the output 60.

The circuit 54 generally comprises a transistor M3, a transistor M4, and a transistor M5. The transistors M3 and M4 are generally implemented as NMOS transistors. The transistor M5 is generally implemented as a PMOS transistor. The transistors M3, M4, and M5 may be implemented as one or more MOSFET transistors. However, other types of transistors may be implemented accordingly to meet the design criteria of a particular implementation. The gates of the transistor M3 and the transistor M5 are generally connected to the input 64. The source of the transistor M3 is generally connected to the ground voltage VGND. The gate of the transistor M4 is generally connected to the input 62. The drain of the transistor M4 and the source of the transistor M5 are generally connected to the supply voltage VPWR. The drain of the transistor M3, the source of the transistor M4, and the drain of the transistor M5 are generally connected to the output 66.

The signal IN is generally presented to the input 58.

When the signal IN transitions HIGH (e.g., rises to about VCCIO) (i) the transistor M2 is generally shut OFF, (ii) the transistor M1 is generally turned ON, and (iii) the drain of the transistor M1 and the output 60 are generally driven to the ground voltage VGND.

When the signal IN transitions LOW (e.g., falls to about VGND) (i) the transistor M1 is generally shut OFF, (ii) the transistor M2 is generally turned ON, and (iii) the drain of the transistor M2 and the output 60 are generally driven to the supply voltage VCCIO.

The state of the output 60 is generally presented as the signal PU. The signal PU is generally presented to the input 62 by the circuit 52. The signal IN is generally presented to the input 64. When the signal IN is LOW, the gates of the transistors M3 and M5 will generally be pulled LOW. When the gate of the transistor M3 is pulled LOW, the transistor M3 will generally be shut OFF. When the gate of the transistor M5 is LOW, the transistor M5 will generally be conducting. When the signal IN is LOW, the signal PU will generally be HIGH. When the signal PU is HIGH, the gate of the transistor M4 will generally be pulled HIGH. When the gate of the transistor M4 is pulled HIGH, the transistor M4 will generally be conducting. With the transistor M3 shut OFF and the transistors M4 and M5 conducting, the signal OUT will generally be driven to the supply voltage VPWR.

When the signal IN is HIGH, the gates of the transistors M3 and M5 will generally be pulled HIGH. When the gate of the transistor M3 is pulled HIGH, the transistor M3 will generally be conducting. When the gate of the transistor M5 is HIGH, the transistor M5 will generally be shut OFF. When the signal IN is HIGH, the signal PU will generally be LOW. When the signal PU is LOW, the gate of the transistor M4 will generally be pulled LOW. When the gate of the transistor M4 is pulled LOW, the transistor M4 will generally be shut OFF. With the transistor M3 conducting and the transistors M4 and M5 shut OFF, the signal OUT will generally be driven to the ground VGND.

The transistor M5 is generally used to prevent crowbar currents in the circuit 54. Crowbar current may occur when the signal IN is low. In such a state, the transistor M4 will generally be conducting. Under certain conditions, the transistor M4 may not conduct the full potential of the second supply voltage VPWR, and the signal OUT may not be pulled to the second supply voltage VPWR. Crowbar current may occur when the signal OUT is not pulled all the way to the second supply voltage VPWR. In particular, crowbar current may occur when the signal OUT is greater than the threshold Vtn (e.g., n-channel threshold that may be ~0.8V for a particular technology shown in the figures), but less than VPWR−Vtp (where Vtp is a p-channel threshold for a particular technology, or ~0.6V). The voltage range of Vtn<OUT<VPWR−Vtp is such that the circuit being driven will have both the n-channel devices and the p-channel devices conducting (n-channel devices generally require an input potential greater than Vtn to conduct, p-channel devices generally require an input potential of less than VPWR−Vtp to conduct), and thus crowbar current occurs.

The conditions for which the transistor M4 cannot conduct the full potential of the second supply voltage VPWR may occur when a minimum voltage drop of Vtn occurs between the input 62 and the output 59. Therefore, the circumstance for which the signal OUT pulls up to less than VPWR−Vtp may occur when VCCIO<VPWR−(Vtp−Vtn). The transistor M5 may prevent the problem of crowbar currents by pulling the signal OUT all the way to the second supply voltage VPWR when the signal IN is pulled low. In design criteria that do not require low VCCIO operation, the transistor M5 may be eliminated.

Referring to FIG. 5, a detailed circuit diagram illustrating the circuit 50 comprising an alternative core circuit 54' is shown. The circuit 54' generally comprises an NMOS transistor M3' and an NMOS transistor M4'. The transistors M3' and M4' operate in a similar fashion as the transistors M3 and M4, described above in connection with the circuit 54.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
    a first device configured to operate at a first supply voltage and generate a pull-up signal in response to an input signal; and
    a CMOS inverter and an NMOS pull-up transistor configured to operate at a second supply voltage and generate an output signal in response to (i) said input signal and (ii) said pull-up signal.

2. The circuit according to claim 1, wherein said circuit is an input buffer.

3. The circuit according to claim 1, wherein said circuit is a level shifter.

4. The circuit according to claim 1, wherein said first supply voltage is greater than said second supply voltage.

5. The circuit according to claim 4, wherein said first supply voltage is greater than said second supply voltage by a voltage equal to a threshold voltage of an NMOS device minus a threshold voltage of a PMOS device.

6. The circuit according to claim 4, wherein said second supply voltage is less than said first supply voltage by a voltage equal to a threshold voltage of an NMOS device minus a threshold voltage of a PMOS device.

7. The circuit according to claim 1, wherein said first device comprises a CMOS inverter.

8. The circuit according to claim 1, wherein said circuit comprises two or more NMOS transistors.

9. The circuit according to claim 1, wherein said second supply voltage varies from 1.6V to 2.0V and said first supply voltage varies from 2.2V to 3.7V.

10. The circuit according to claim 1, wherein said output signal is presented to a core logic circuit.

11. The circuit according to claim 1, wherein said input signal is generated by an external circuit.

12. A circuit comprising:
    means for generating a pull-up signal in response to an input signal, said pull-up generating means operating at a first supply voltage; and
    means for generating an output signal in response to (i) said input signal and (ii) said pull-up signal, said output generating means (i) comprises a CMOS inverter and an NMOS pull-up transistor, and (ii) operates at a second supply voltage.

13. The circuit according to claim 12, wherein said first supply voltage is greater than said second supply voltage.

14. A method for buffering and/or level shifting an input signal comprising the steps of:
    (A) generating a pull-up signal in response to an input signal, wherein said input signal and said pull-up signal swing between a ground voltage and a first supply voltage; and
    (B) generating an output signal in response to (i) said input signal and (ii) said pull-up signal, wherein said output signal swings between said ground voltage and a second supply voltage, wherein step (B) comprises the sub-steps of (B-1) testing the state of said input signal; (B-2) if said input signal is at a first logic state, (i) turning off an NMOS pull-down device and (ii) turning on an NMOS pull-up device; and (B-3) if said input signal is at a second logic state, (i) turning on said NMOS pull-down device and (ii) turning off said NMOS pull-up device.

15. The method according to claim 14, wherein said first supply voltage is greater than said second supply voltage.

16. The method of claim 14, wherein the step (A) comprises generating an inverted version of said input signal.

17. The method according to claim 14, further comprising the sub-step of:
    (B-4) preventing crowbar currents using a PMOS pullup device in addition to the NMOS pull-up device when said second supply voltage is greater than said first supply voltage by a voltage equal to a threshold voltage of an NMOS device minus a threshold voltage of a PMOS device.

18. The method according to claim 14, further comprising the sub-step of:
    (B-4) preventing crowbar currents using a PMOS pull-up device in addition to the NMOS pull-up device when said first supply voltage is less than said second supply voltage by a voltage equal to a threshold voltage of an NMOS device minus a threshold voltage of a PMOS device.

* * * * *